(12) United States Patent
Yang

(10) Patent No.: US 9,215,828 B1
(45) Date of Patent: Dec. 15, 2015

(54) SERVER CASE ASSEMBLY

(71) Applicants: Inventec (Pudong) Technology Corporation, Shanghai (CN); INVENTEC CORPORATION, Taipei (TW)

(72) Inventor: Chi Chun Yang, Taipei (TW)

(73) Assignees: INVENTEC (PUDONG) TECHNOLOGY CORPORATION, Shanghai (CN); INVENTEC CORPORATION, Taipei (TW)

(*) Notice: Subject to any disclaimer, the term of this patent is extended or adjusted under 35 U.S.C. 154(b) by 0 days.

(21) Appl. No.: 14/677,397

(22) Filed: Apr. 2, 2015

(30) Foreign Application Priority Data

Nov. 26, 2014 (CN) .......................... 2014 1 0692504

(51) Int. Cl.
*H05K 5/02* (2006.01)
*H05K 7/14* (2006.01)
*H05K 5/03* (2006.01)
*H05K 5/00* (2006.01)

(52) U.S. Cl.
CPC ............ *H05K 7/1485* (2013.01); *H05K 5/0004* (2013.01); *H05K 5/023* (2013.01); *H05K 5/0247* (2013.01); *H05K 5/03* (2013.01)

(58) Field of Classification Search
CPC .......... H05K 5/02; H05K 5/03; H05K 5/023; H05K 5/0004; H05K 5/0247; H05K 7/1485; H05K 7/1488; A47B 95/02; A47B 2095/021; Y10T 16/36; Y10T 16/42; Y10T 16/44; Y10T 16/50; Y10T 16/469; Y10T 16/473; Y10T 16/557; Y10T 16/438; G11B 33/025
USPC ......... 312/223.1, 223.2, 332.1, 244; 361/725, 361/726, 727
See application file for complete search history.

(56) References Cited

U.S. PATENT DOCUMENTS

| | | | | | |
|---|---|---|---|---|---|
| 2,514,246 | A | * | 7/1950 | Knox | H05K 7/04 174/541 |
| 2,940,114 | A | * | 6/1960 | Wulc | H05K 5/023 16/445 |
| 3,120,412 | A | * | 2/1964 | Caldwell | H05K 7/1411 312/332.1 |
| 3,521,939 | A | * | 7/1970 | Vaughn | A47B 88/16 312/215 |
| 5,020,151 | A | * | 5/1991 | Sampei | B60R 11/0205 312/7.1 |
| 6,231,144 | B1 | * | 5/2001 | Chen | H05K 7/1411 312/223.2 |
| 6,820,953 | B2 | * | 11/2004 | Wojcik | G11B 33/123 312/332.1 |
| 7,168,772 | B1 | * | 1/2007 | Liang | G06F 1/183 292/336.3 |
| 8,037,578 | B2 | * | 10/2011 | Megason | F16C 11/04 16/2.1 |

(Continued)

*Primary Examiner* — James O Hansen
(74) *Attorney, Agent, or Firm* — Muncy, Geissler, Olds & Lowe, P.C.

(57) ABSTRACT

A server case assembly includes a fixed component assembly further having a first connection component, a second connection component, and a penetration component. The first connection component has a first communication space, and includes a first withstanding portion and a first convex portion. The first withstanding to portion withstands an inner sidewall of a case body. The first convex portion is connected to the first withstanding portion, and passes through a sidewall of the case body. The second connection component has a second communication space, and includes a second withstanding portion and a second convex portion. The second withstanding portion withstands a handle, and is connected to the second convex portion. The second convex portion passes through the first communication space. The penetration component passes through the first and second communication spaces to fix the first and second connection components so as to fix the handle on the case body.

10 Claims, 12 Drawing Sheets

(56) References Cited

U.S. PATENT DOCUMENTS

| | | | |
|---|---|---|---|
| 8,526,191 B2 * | 9/2013 | Peng | G11B 33/124 206/701 |
| 2009/0033103 A1 * | 2/2009 | Klassen | E05C 9/1875 292/216 |
| 2011/0309730 A1 * | 12/2011 | Retchloff | E05C 3/14 312/332.1 |

* cited by examiner

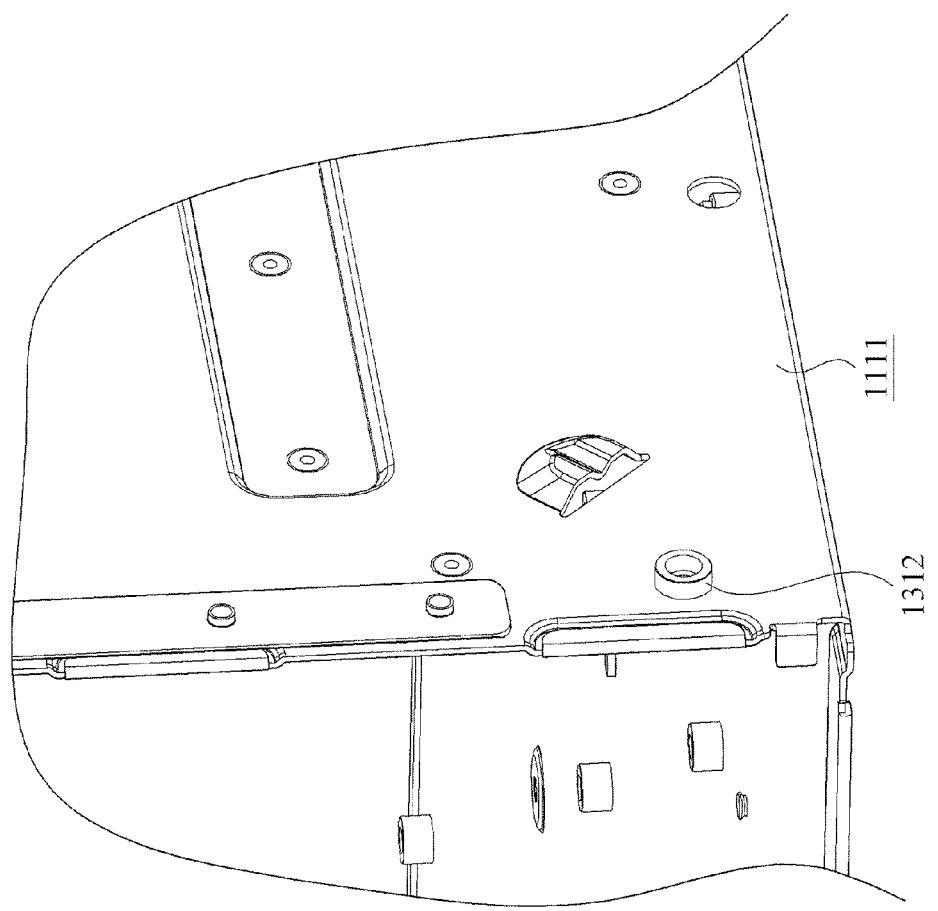

SERVER CASE ASSEMBLY

BACKGROUND OF INVENTION

1. Field of the Invention

The invention relates to a server case assembly, and more particularly to the server case assembly that a fixed component assembly can be introduced to distribute the forcing while a handle drives a case body to displace.

2. Description of the Prior Art

As the communication and information technology progresses promptly, the blooming in networking has made people's life versatile with various electronic devices. In establishing a network, the server is one of those that can't be negligible. In general, a traditional server is usually equipped with a larger number of hard disks and servo main frames to meet the storage needs and to improve the processing efficiency. To make more extension for the server system, the rack mounted servers are then emerged. A typical rack mounted server system usually includes plural case assemblies, and the aforesaid hard disks and main frames are usually mounted inside respective case bodies of the case assemblies. In such a design, the case body carrying a hard disk or a main frame (the load) is usually too heavy to be directly pulled out, and thereby a handle installed to the case body for facilitating the pull-out of the load is introduced to the rack mounted server system.

Referring now to FIG. 1, a typical conventional design of a connection of the handle and the case body is shown. As shown, this current connection pattern of the handle PA11 and the case body PA12 for the case assembly PA1 is a riveted joint. Referring further to FIG. 2, another conventional connection design of the handle and the case body is shown. In FIG. 2, the connection pattern of the handle PA21 and the case body PA22 for the case assembly PA2 is established by introducing an additional component PA23 (a rivet for example) to fix the handle PA21 to the case body PA22. Nevertheless, no matter what kind of the aforesaid connection patterns is applied, the material strength thereof is limited, and thus the service life is short, such that the handle is opt to get loose from the case body. Therefore, this aforesaid connection art needs to be improved.

SUMMARY OF THE INVENTION

Accordingly, in order to improve the connection strength between the handle and the case body and to extend the service life of this connection, it is the primary object of the present invention to provide a server case assembly, which introduce two connection components and a penetration component to fix the handle to the case body so as to distribute the forcing and thus resolve the aforesaid problem in joint strength.

In the present invention, the server case assembly includes a case body, a handle and a fixed component assembly. A side plate of the case body further has a case installation hole, an outer sidewall and an inner sidewall. The handle mounted on the outer sidewall further has a handle installation hole corresponding in position aligned with the case installation hole. The fixed component assembly for fixing the handle onto the case body further includes a first connection component, a second connection component and a penetration component. The first connection component having a first communicative space further includes a first withstanding portion and a first convex portion, in which the first withstanding portion withstands the inner sidewall, while the first convex portion connects the first withstanding portion and passes through the case installation hole and the handle installation hole. The second connection component having a second communicative space further includes a second withstanding portion and a second convex portion, in which the second withstanding portion withstands the handle, while the second convex portion connects the second withstanding portion and passes through the first communicative space so as to connect in space the second communicative space and the first communicative space. The penetration component is to pass through the first communicative space and the second communicative space so as to mount the handle onto the case body by fixing the first connection component and the second connection component. Upon such an arrangement as stated above, while the handle is forced to displace the case body along a moving path, a load applied to the first connection component is distributed to the side plate of the case body through the first withstanding portion and the first convex portion.

In another aspect of the present invention, the server case assembly for fixing a handle having a handle installation hole includes a case body and a fixed component assembly. A side plate of the case body further has a case installation hole, an outer sidewall and an inner sidewall. The handle is mounted onto the outer sidewall by aligning the handle installation hole and the respective case installation hole. The fixed component assembly for fixing the handle onto the case body further includes a first connection component, a second connection component and a penetration component. The first connection component having a first communicative space further includes a first withstanding portion and a first convex portion, in which the first withstanding portion withstands the inner sidewall, while the first convex portion connects the first withstanding portion and passes through the case installation hole and the handle installation hole. The second connection component having a second communicative space further includes a second withstanding portion and a second convex portion, in which the second withstanding portion withstands the handle, while the second convex portion connects the second withstanding portion and passes through the first communicative space so as to connect in space the second communicative space and the first communicative space. The penetration component is to pass through the first communicative space and the second communicative space so as to mount the handle onto the case body by fixing the first connection component and the second connection component. Upon such an arrangement as stated above, while the handle is forced to displace the case body along a moving path, a load applied to the first connection component is distributed to the side plate of the case body through the first withstanding portion and the first convex portion.

In one embodiment of the present invention, the first withstanding portion has a first withstanding hole, the first convex portion has a first convex hole, the first withstanding hole and the first convex hole are connected to form the first communicative space, and a diameter of the first withstanding hole is smaller than that of the first convex hole.

In one embodiment of the present invention, the second withstanding portion has a second withstanding hole, the second convex portion has a second convex hole, the second withstanding hole and the second convex hole are connected to form the second communicative space, and a diameter of the second withstanding hole is smaller than that of the second convex hole.

In one embodiment of the present invention, the penetration component includes a pass-through withstanding portion and a pass-through portion. The pass-through withstanding portion withstands the first withstanding portion, while the pass-through portion passes through the first communicative space and the second communicative space.

In one embodiment of the present invention, the first connection component and the second connection component are both screw bolts, the penetration component is a pop rivet, and both the case installation hole and the handle installation hole are formed as respective holes.

By providing the server case assembly according to the present invention, for the forcing upon the connection component can be distributed to the sidewall of the case body via the first withstanding portion and the first convex portion, so the service life of the connection can be extended.

All these objects are achieved by the server case assembly described below.

BRIEF DESCRIPTION OF THE DRAWINGS

The present invention will now be specified with reference to its preferred embodiment illustrated in the drawings, in which:

FIG. 6 is a schematic perspective view showing the engagement of the first connection component and the case installation hole of the preferred embodiment in accordance with the present invention;

DESCRIPTION OF THE PREFERRED EMBODIMENT

The invention disclosed herein is directed to a server case assembly. In the following description, numerous details are set forth in order to provide a thorough understanding of the present invention. It will be appreciated by one skilled in the art that variations of these specific details are possible while still achieving the results of the present invention. In other instance, well-known components are not described in detail in order not to unnecessarily obscure the present invention.

For various embodiments and combinations can be provided to the server case assembly according to the present invention, yet, by limited to the space in this application, only the preferred embodiment there-among is raised to elucidate the features of the present invention.

Figure 1:
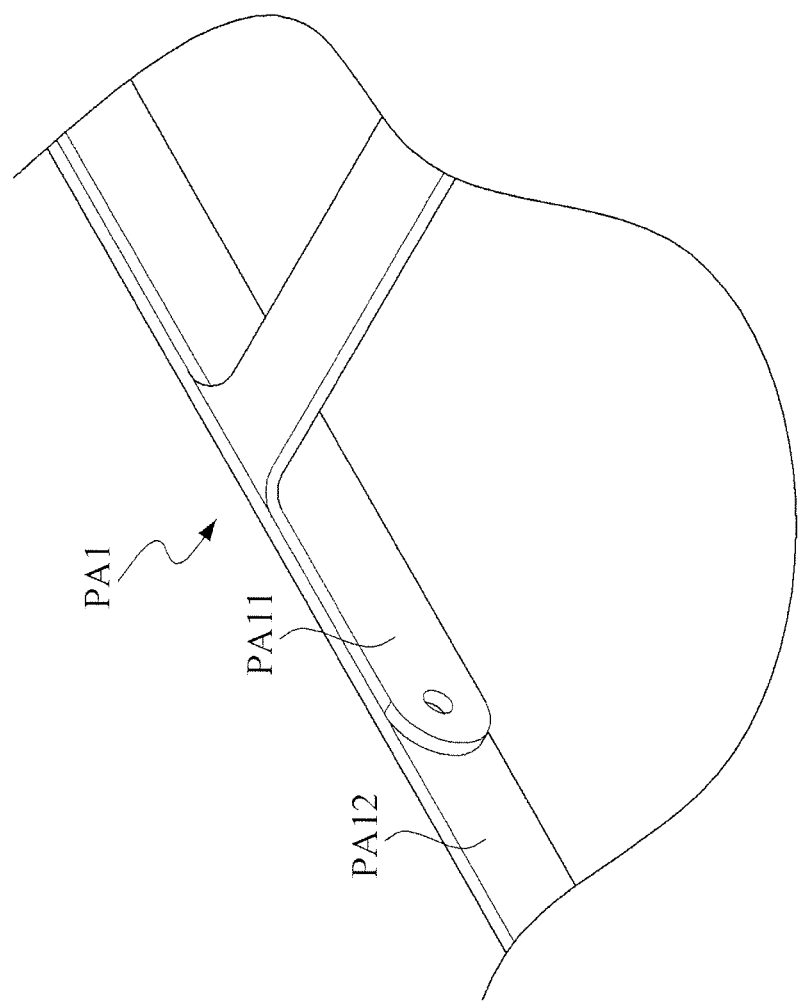
FIG. 1 demonstrates schematically a conventional connection pattern of a handle and a case body in the art.
Figure 2:
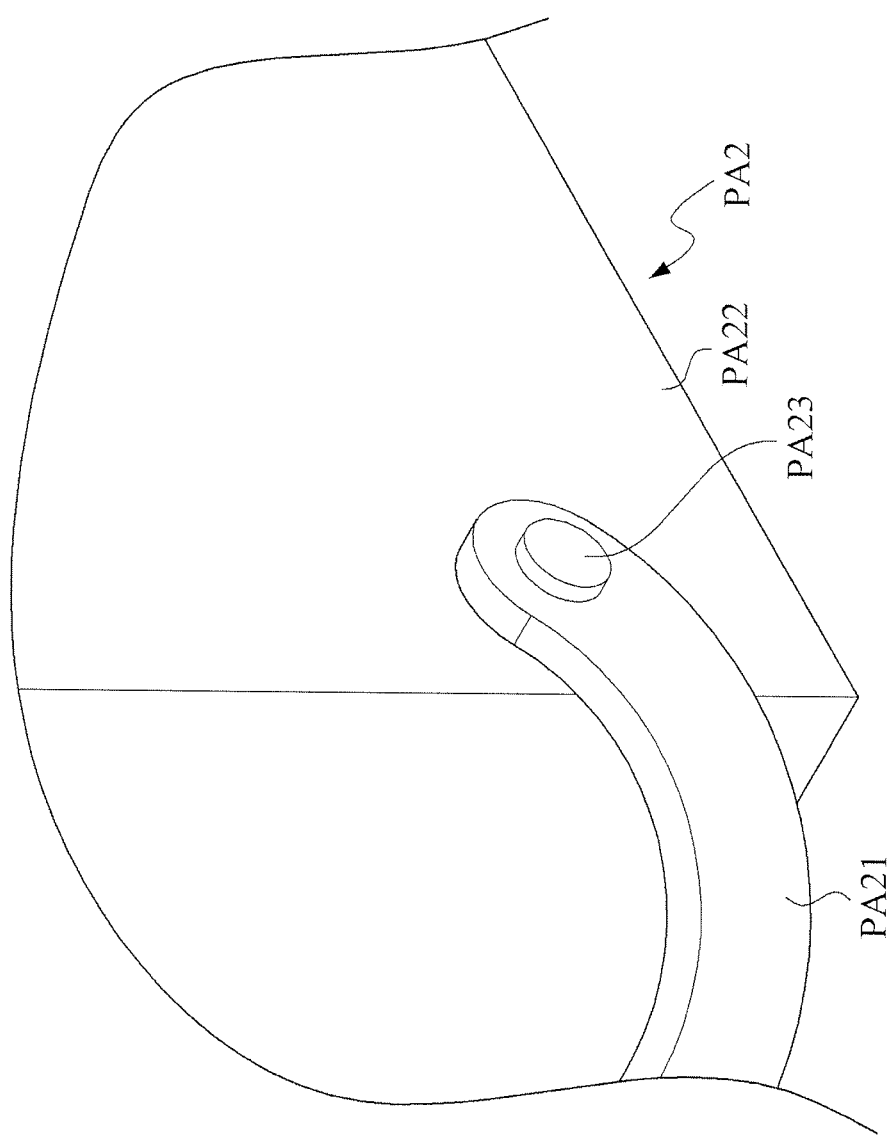
FIG. 2 demonstrates another connection pattern of the handle and the case body in the art.
Figure 3:
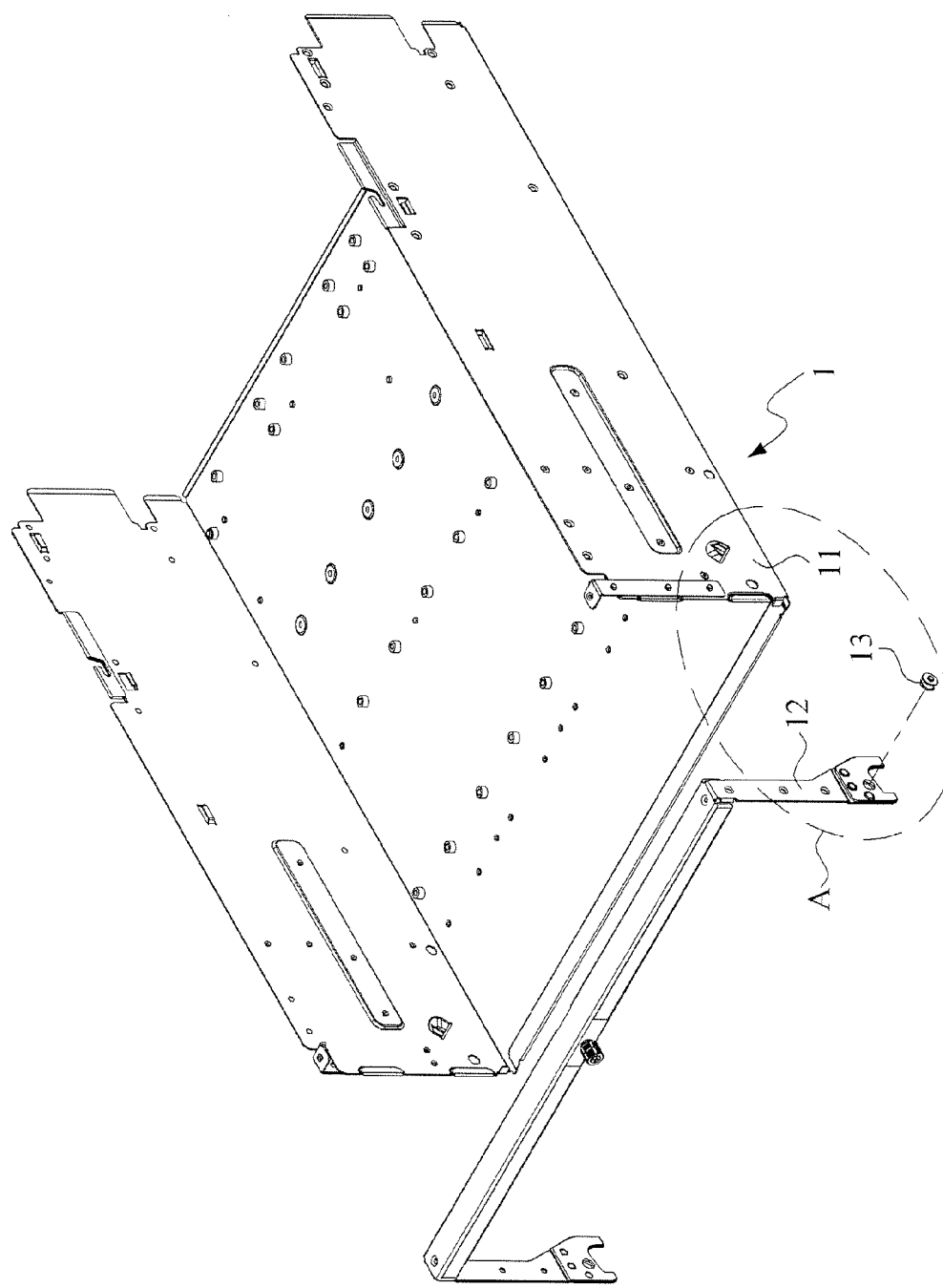
FIG. 3 is substantial a schematic exploded view of a preferred embodiment of the server case assembly in accordance with the present invention.
Figure 3A:
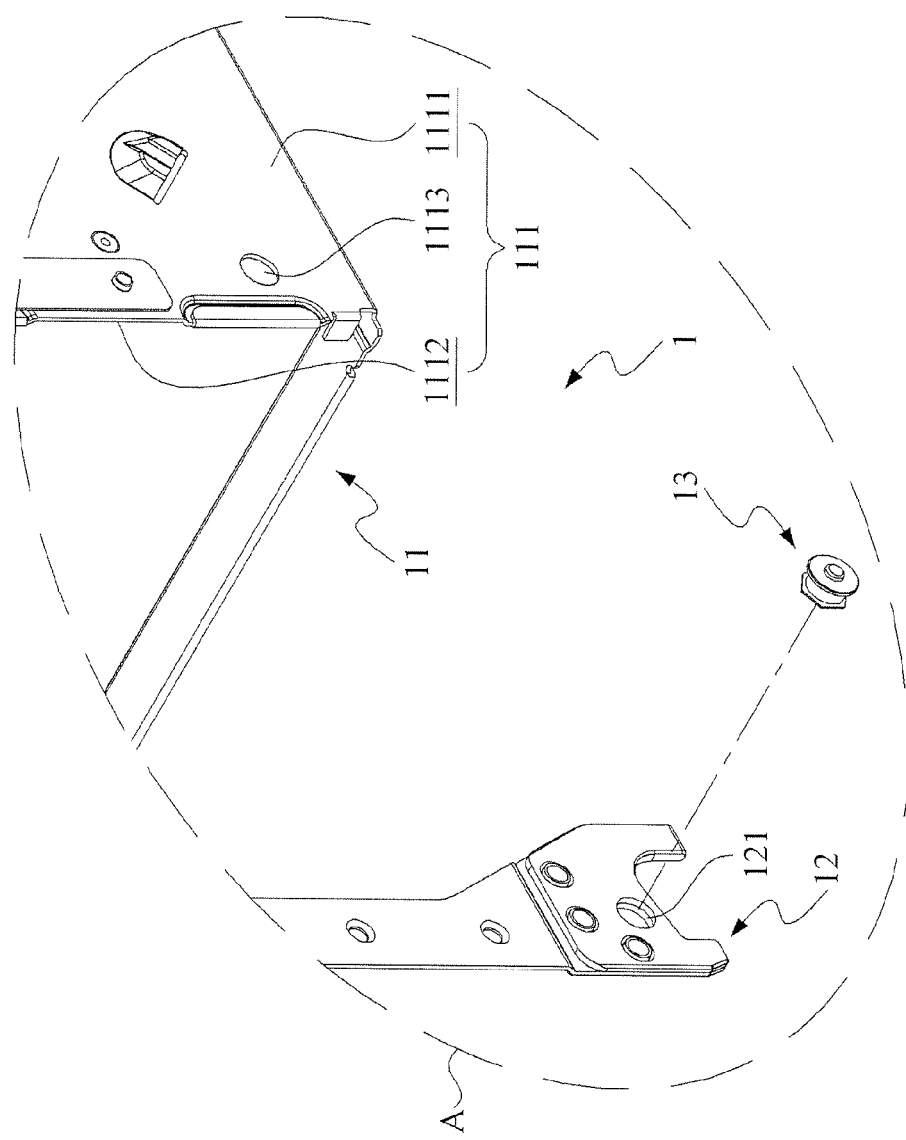
FIG. 3A is an enlarged view of area A of FIG. 3.
Figure 4:
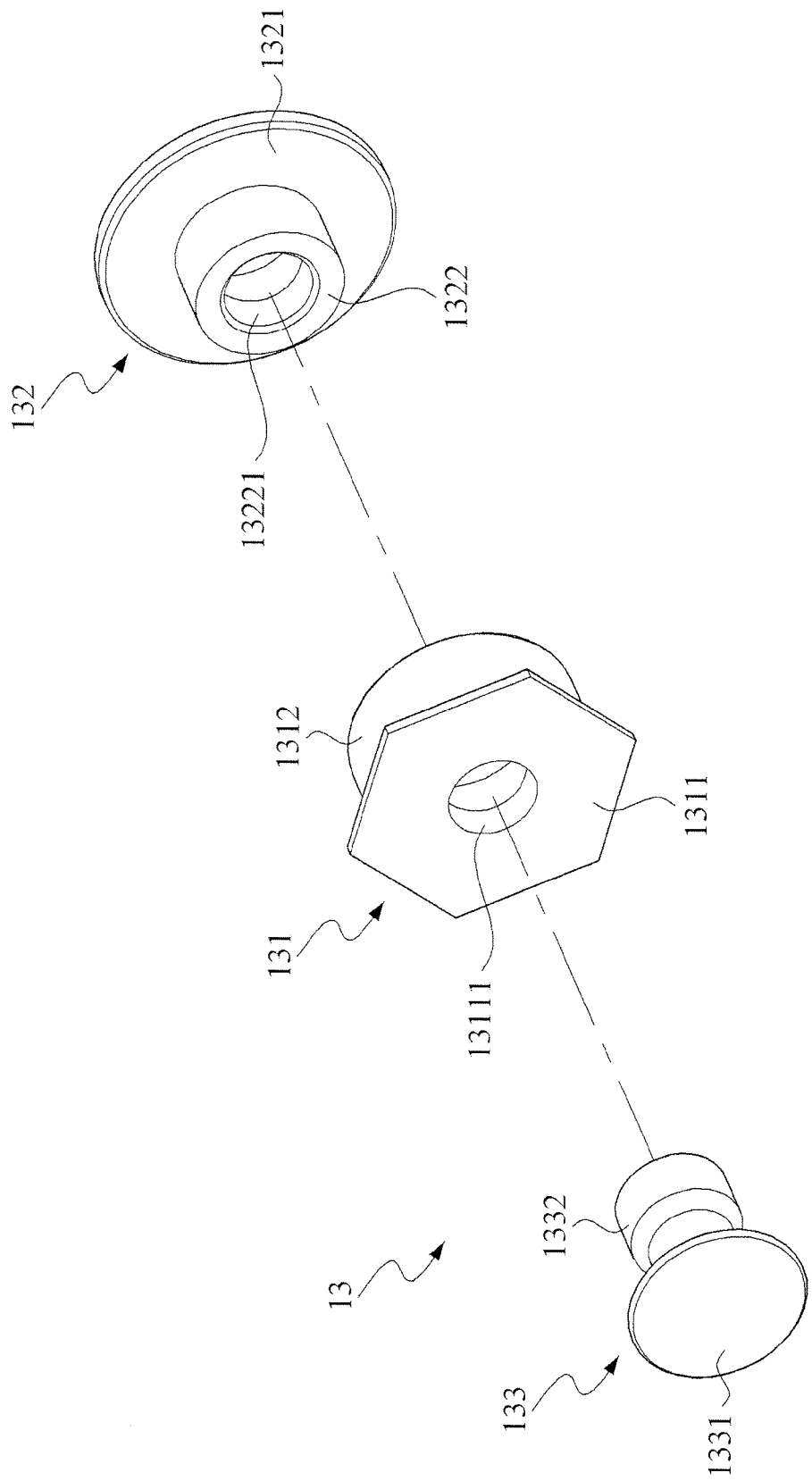
FIG. 4 is an exploded view of the fixed component assembly of FIG. 3.
Figure 5:
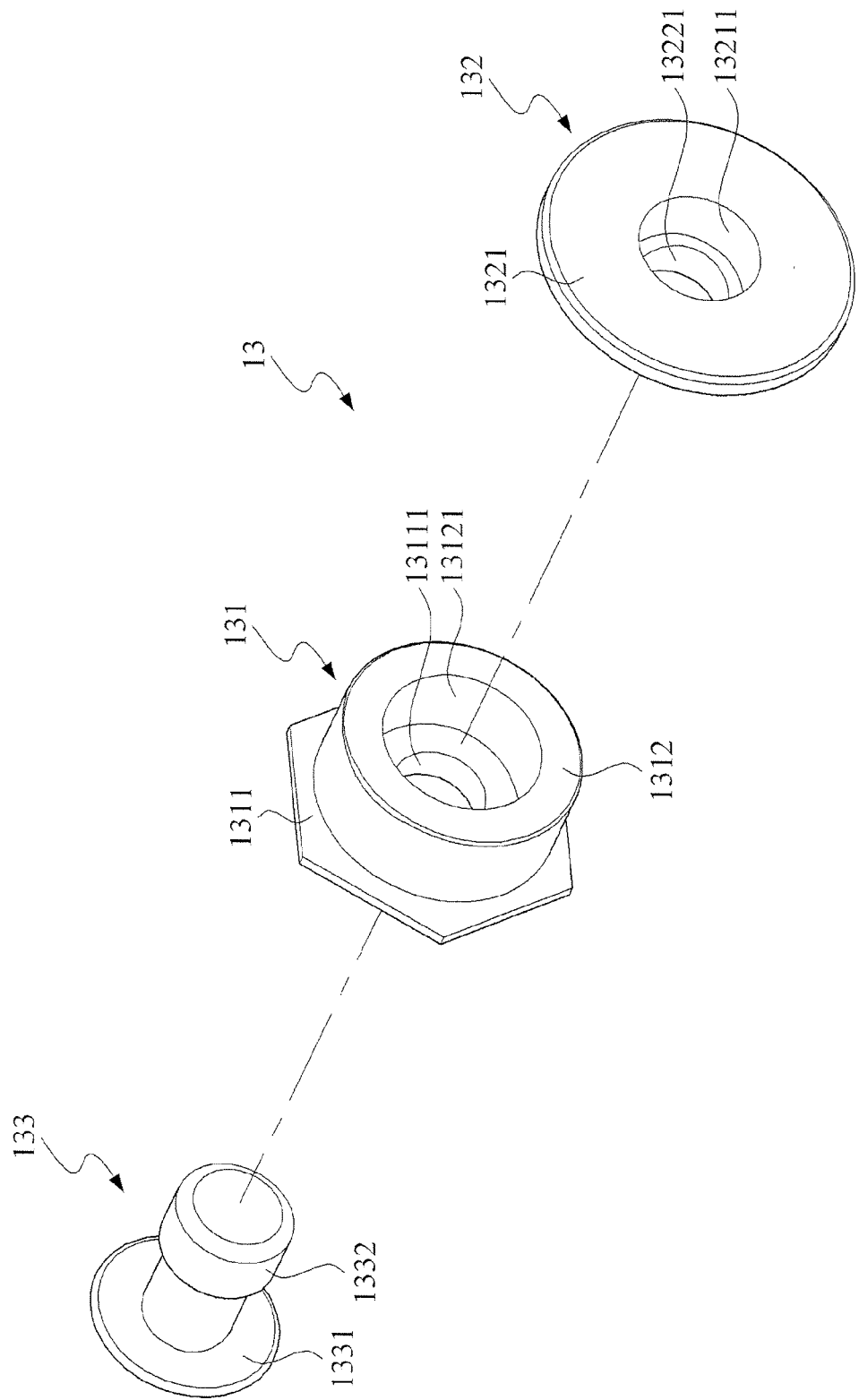
FIG. 5 is another view of FIG. 4.
Figure 6A:
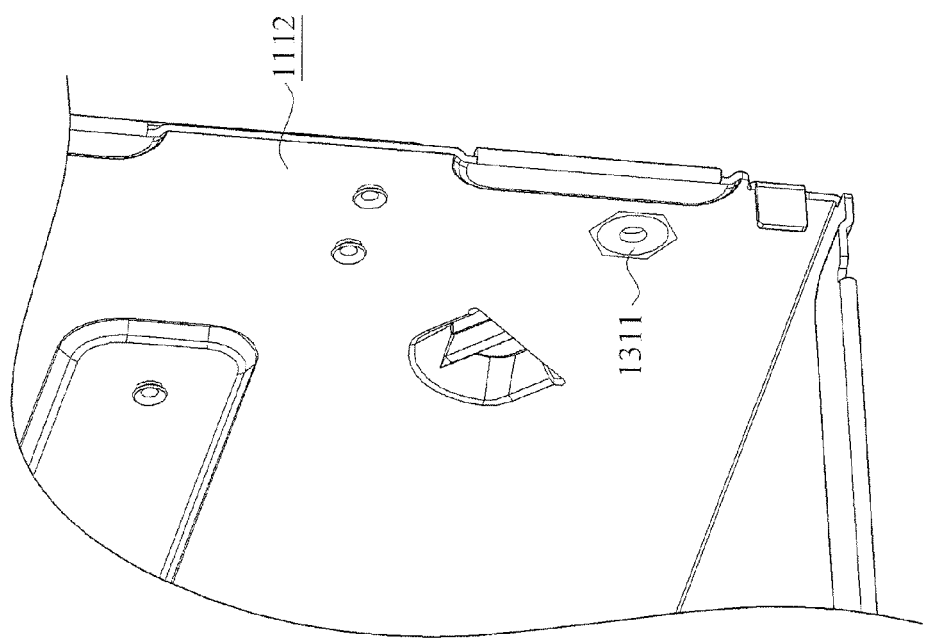
FIG. 6A is another view of FIG. 6.
Figure 7:
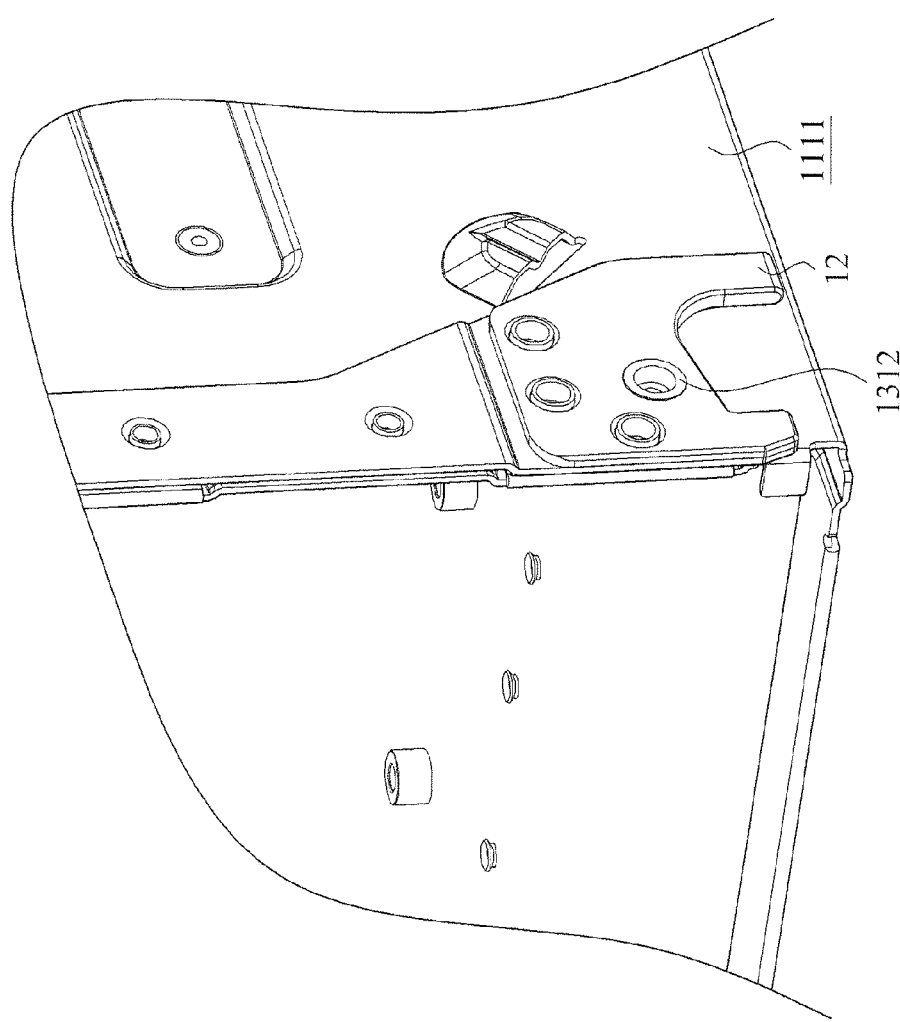
FIG. 7 is a schematic perspective view showing the engagement of the first connection component and the handle of the preferred embodiment in accordance with the present invention.
Figure 8:
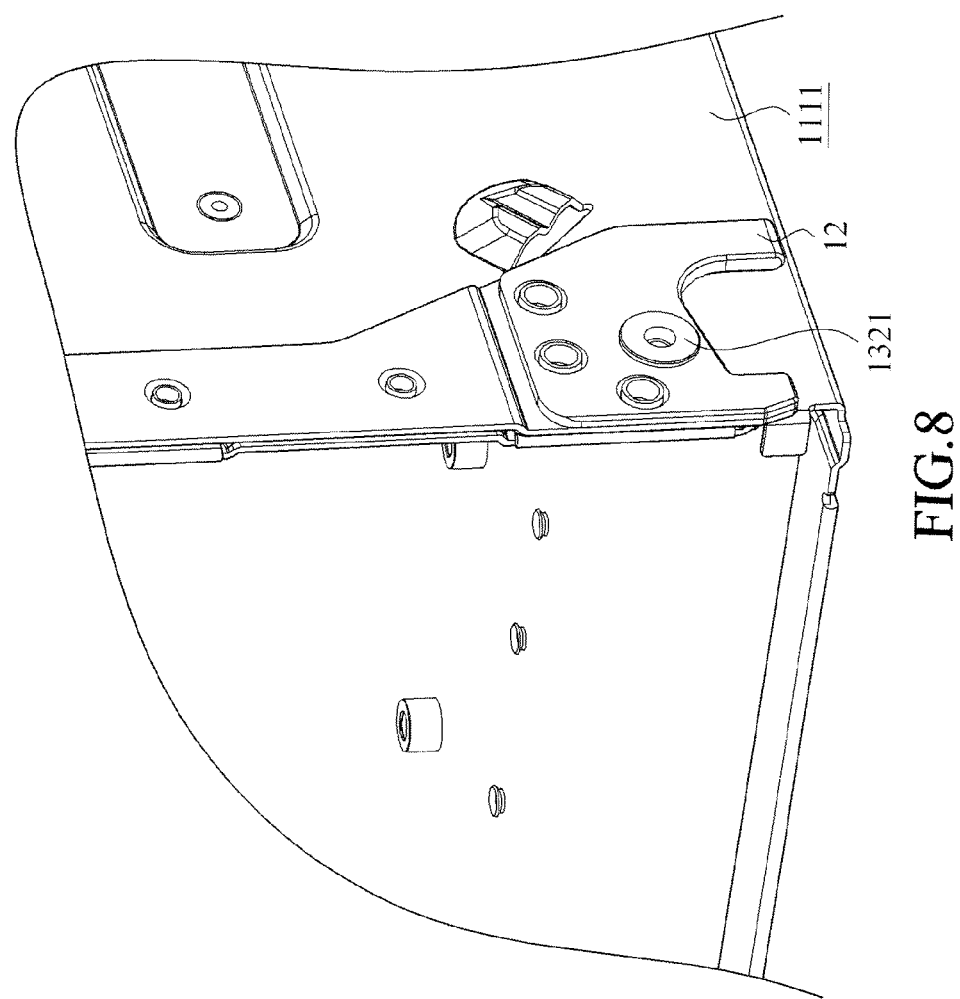
FIG. 8 is a schematic perspective view showing the engagement of the first connection component and the second connection component of the preferred embodiment in accordance with the present invention.
Figure 9:
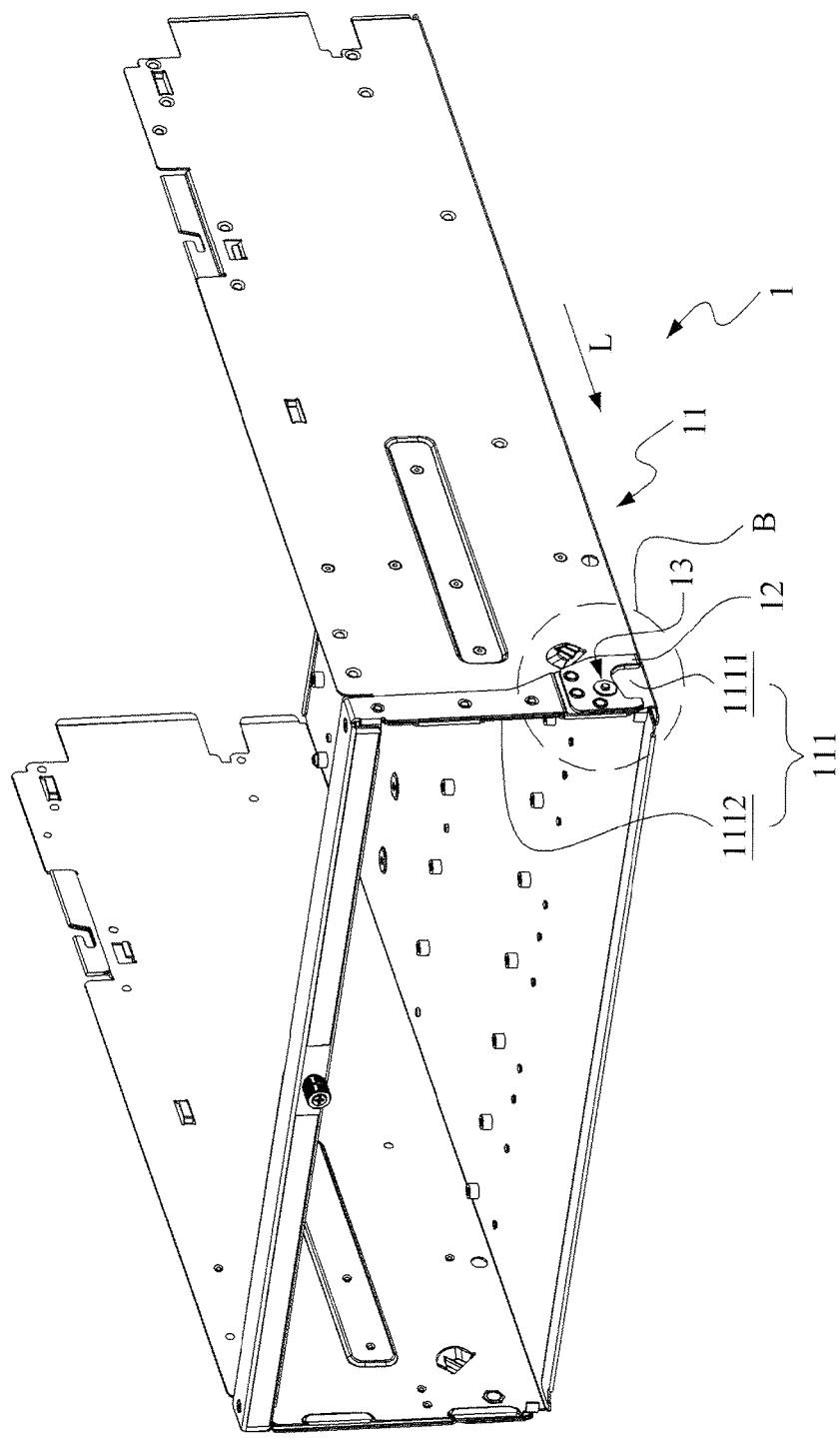
FIG. 9 is a schematic perspective view showing a state that the penetration component passes through the first connection component and the second connection component.
Figure 9A:
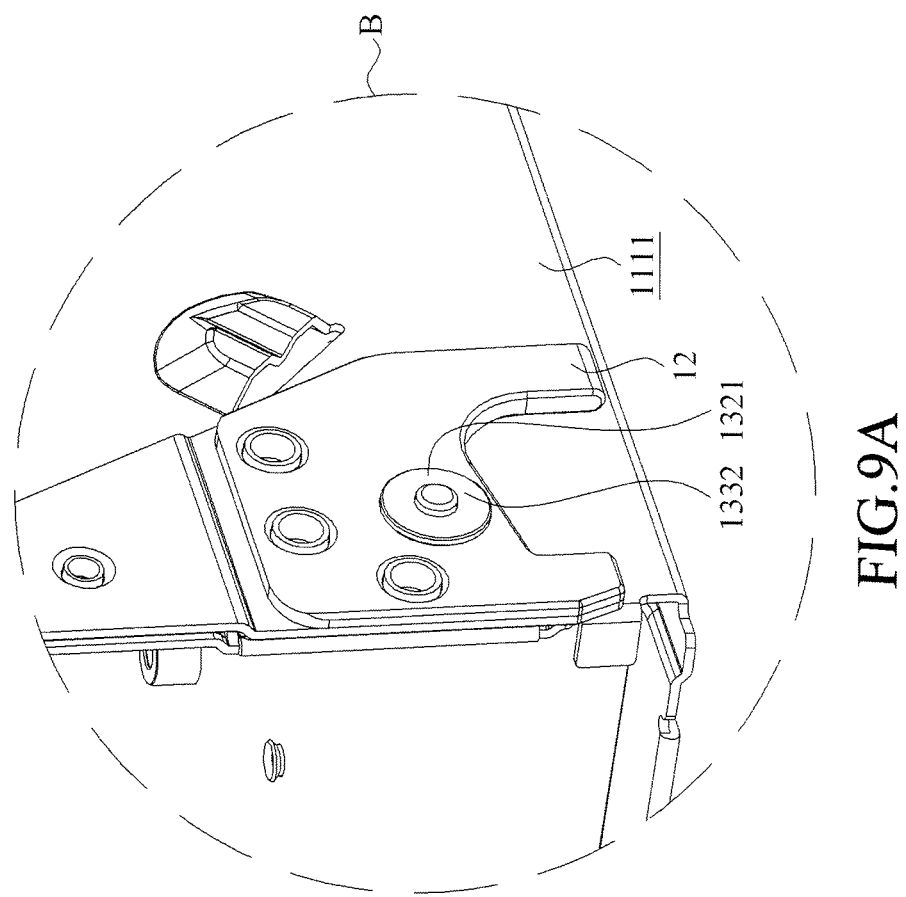
FIG. 9A is an enlarged view of area B of FIG. 9.

Refer now to FIG. 3 through FIG. 9A, in which FIG. 3 is substantial a schematic exploded view of a preferred embodiment of the server case assembly in accordance with the present invention, FIG. 3A is an enlarged view of area A of FIG. 3, FIG. 4 is an exploded view of the fixed component assembly of FIG. 3, FIG. 5 is another view of FIG. 4, FIG. 6 is a schematic perspective view showing the engagement of the first connection component and the case installation hole of the preferred embodiment in accordance with the present invention, FIG. 6A is another view of FIG. 6, FIG. 7 is a schematic perspective view showing the engagement of the first connection component and the handle of the preferred embodiment in accordance with the present invention, FIG. 8 is a schematic perspective view showing the engagement of the first connection component and the second connection component of the preferred embodiment in accordance with the present invention, FIG. 9 is a schematic perspective view showing a state that the penetration component passes through the first connection component and the second connection component, and FIG. 9A is an enlarged view of area B of FIG. 9.

As shown, the preferred embodiment of the server case assembly 1 in accordance with the present invention is a server case applicable to (but not limited to) the current rack mounted server or the blade server. The server case assembly 1 includes a case body 11, a handle 12 and a fixed component assembly 13.

The case body 11 has a side plate 111 consisted of an outer sidewall 1111 and an inner sidewall 1112, and the side plate 111 further has a case installation hole 1113. Practically, the case installation hole 1113 as mainly a penetration hole is to communicate in space between the outer sidewall 1111 and the inner sidewall 1112. It shall be noted that, in FIG. 3, another side plate similar to the aforesaid side plate 111 is located parallel to the side plate 111 by a predetermined spacing. These two side plates can be identical in structuring, and thus only one of them is explained in details in this disclosure.

The handle 12 is mounted to the outer sidewall 1111, and has a handle installation hole 121 located respective to the case installation hole 1113. Namely, the handle installation hole 121 is also embodied as a hole. Similarly, though other end of the handle 12 also includes a handle installation hole, yet, for a concise explanation, only one-side handle installation hole 121 is labeled and elucidated in this disclosure.

The fixed component assembly 13 is to fix the case body 11 and the handle 12; i.e. to mount the handle 12 fixedly onto the case body 11. The fixed component assembly 13 further includes a first connection component 131, a second connection component 132 and a penetration component 133.

The first connection component 131 embodied as a screw bolt or any the like has a first communicative space (not labeled in the figure), and includes a first withstanding portion 1311 and a first convex portion 1312. In practice, the first withstanding portion 1311 is to withstand the inner sidewall 1112 and further has a first withstanding hole 13111. The first convex portion 1312 is to connect the first withstanding portion 1311, and to pass through the case installation hole 1113 and the handle installation hole 121. The first convex portion 1312 has a first convex hole 13121, a first withstanding hole 13111 and a first convex hole 13121, in which the foregoing three holes 13121, 12111 and 13121 are connected in space to form the aforesaid first communicative space. In addition, a diameter of the first withstanding hole 13111 is smaller than that of the first convex hole 13121 (as shown in FIG. 4 and FIG. 5).

The second connection component 132 embodied as a screw bolt or any the like has a second communicative space (not labeled in the figure), and includes a second withstanding portion 1321 and a second convex portion 1322. The second withstanding portion 1321 is to withstand the handle 12 (as shown in FIG. 7) and further has a second withstanding hole 13211. The second convex portion 1322 is to connect the second withstanding portion 1321, and has a second convex hole 13221. The second withstanding hole 13211 and the second convex hole 13221 are connected in space to form the aforesaid second communicative space. Further, a diameter of the second withstanding hole 13211 is larger than that of the second convex hole 13221 (as shown in FIG. 4 and FIG. 5). In addition, the second convex portion 1322 passes through the first communicative space (as shown in FIG. 7), and thus the second communicative space and the first communicative space can communicate to each other in space.

The penetration component 133 is to pass through the first communicative space and the second communicative space so as to mount fixedly the handle 12 to the case body 11 by fixing the first connection component 131 and the second connection component 132.

Practically, the penetration component 133 can be a pop rivet or any the like, and further includes a pass-through withstanding portion 1331 and a pass-through portion 1332, in which the pass-through withstanding portion 1331 is to withstand the first withstanding portion 1311, and the pass-through portion 1332 is to pass through the first communicative space and the second communicative space so as to fix the first connection component 131 and the second connection component 132.

In addition, while in assembling the server case assembly 1 of the present invention, the first connection component 131 can be firstly mounted into the case installation hole 1113 by having the first withstanding portion 1311 to withstand the inner sidewall 1112, the first convex portion 1312 to pass through the case installation hole 1113, and the first convex portion 1312 to mate the case installation hole 1113 (in some other embodiments, a screw can be applied). Then, the handle 12 is sleeved onto the first convex portion 1312 of the first connection component 131 through the handle installation hole 121, in which the handle installation hole 121 can be rotationally tight to the first convex portion 1312. Further, the second convex portion 1322 of the second connection component 132 passes through the first communicative space to have the second withstanding portion 1321 to withstand the handle 12, wherein the second convex portion 1322 is firmly contacted so as to be fixed in the first communicative space. In some other embodiments, other fixation means can also be applied. Finally, the penetration component 133 passes through the first communicative space of the first connection component 131 and the second communicative space of the second connection component 132 along a penetration direction from the inner sidewall 1112 to the outer sidewall 1111. It is noted that the penetration component 133 is thus to be fixed inside the first communicative space and the second communicative space. The server case assembly 1 of the present invention is then well assembled, as the order shown by figure from FIG. 6 to FIG. 9.

As shown in FIG. 9, while the handle 12 is forced to drive the case body 11 to displace along a moving path L, the shearing originally loaded upon the first connection component 131 is to be distributed to the outer sidewall 1111 and the inner sidewall 1112 via the first withstanding portion 1311 and the first convex portion 1312. Upon such an arrangement, the shearing strength of the fixed component assembly 13 can be substantially increased.

By providing the server case assembly according to the present invention, for the shearing upon the connection component can be distributed to the sidewall of the case body, so the shear strength of the fixed component assembly can be increased and also the service life of the connection can be extended.

While the present invention has been particularly shown and described with reference to a preferred embodiment, it will be understood by those skilled in the art that various changes in form and detail may be without departing from the spirit and scope of the present invention.

What is claimed is:

1. A server case assembly, comprising:
    a case body, having a side plate with a case installation hole, the side plate further having an outer sidewall and an inner sidewall;
    a handle, mounted at the outer sidewall, further having a handle installation hole corresponding in position to the case installation hole; and
    a fixed component assembly, to fix the handle to the case body, further comprising:
    a first connection component, having a first communicative space, further including:
        a first withstanding portion, withstanding the inner sidewall; and
        a first convex portion, connecting the first withstanding portion, passing through the case installation hole and the handle installation hole;
    a second connection component, having a second communicative space, further including:
        a second withstanding portion, withstanding the handle; and
        a second convex portion, connecting the second withstanding portion, passing through the first communicative space so as to communicate in space the second communicative space and the first communicative space; and
    a penetration component, passing through the first communicative space and the second communicative space so as to mount the handle onto the case body by fixing the first connection component and the second connection component;
    wherein, while the handle is forced to displace the case body along a moving path, a load applied to the first connection component is distributed to the side plate of the case body through the first withstanding portion and the first convex portion.

2. The server case assembly of claim 1, wherein the first withstanding portion has a first withstanding hole and the first convex portion has a first convex hole, the first withstanding hole and the first convex hole being connected to form the first communicative space, a diameter of the first withstanding hole being smaller than that of the first convex hole.

3. The server case assembly of claim 1, wherein the second withstanding portion has a second withstanding hole and the second convex portion has a second convex hole, the second withstanding hole and the second convex hole being connected to form the second communicative space, a diameter of the second withstanding hole being larger than that of the second convex hole.

4. The server case assembly of claim 1, wherein the penetration component includes a pass-through withstanding portion and a pass-through portion, the pass-through withstanding portion withstanding the first withstanding portion, the pass-through portion passing through the first communicative space and the second communicative space.

5. The server case assembly of claim 1, wherein each of the first connection component and the second connection component is a screw bolt, the penetration component is a pop rivet, the case installation hole is a hole, and the handle installation hole is another hole.

6. A server case assembly, for fixing a handle having a handle installation hole, comprising:
- a case body, having a side plate with a case installation hole, the side plate further having an outer sidewall and an inner sidewall, the handle being mounted to the outer sidewall by having the handle installation hole aligned with the case installation hole; and
- a fixed component assembly, to fix the handle to the case body, further comprising:
- a first connection component, having a first communicative space, further including:
- a first withstanding portion, withstanding the inner sidewall; and
- a first convex portion, connecting the first withstanding portion, passing through the case installation hole and the handle installation hole;
- a second connection component, having a second communicative space, further including:
- a second withstanding portion, withstanding the handle; and
- a second convex portion, connecting the second withstanding portion, passing through the first communicative space so as to communicate in space the second communicative space and the first communicative space; and
- a penetration component, passing through the first communicative space and the second communicative space so as to mount the handle onto the case body by fixing the first connection component and the second connection component;

wherein, while the handle is forced to displace the case body along a moving path, a load applied to the first connection component is distributed to the side plate of the case body through the first withstanding portion and the first convex portion.

7. The server case assembly of claim 6, wherein the first withstanding portion has a first withstanding hole and the first convex portion has a first convex hole, the first withstanding hole and the first convex hole being connected to form the first communicative space, a diameter of the first withstanding hole being smaller than that of the first convex hole.

8. The server case assembly of claim 6, wherein the second withstanding portion has a second withstanding hole and the second convex portion has a second convex hole, the second withstanding hole and the second convex hole being connected to form the second communicative space, a diameter of the second withstanding hole being larger than that of the second convex hole.

9. The server case assembly of claim 6, wherein the penetration component includes a pass-through withstanding portion and a pass-through portion, the pass-through withstanding portion withstanding the first withstanding portion, the pass-through portion passing through the first communicative space and the second communicative space.

10. The server case assembly of claim 6, wherein each of the first connection component and the second connection component is a screw bolt, the penetration component is a pop rivet, the case installation hole is a hole, and the handle installation hole is another hole.

* * * * *